United States Patent [19]
Lane et al.

[11] Patent Number: 5,851,293
[45] Date of Patent: Dec. 22, 1998

[54] FLOW-STABILIZED WET SCRUBBER SYSTEM FOR TREATMENT OF PROCESS GASES FROM SEMICONDUCTOR MANUFACTURING OPERATIONS

[75] Inventors: Scott Lane, Chandler, Ariz.; Dinesh Shah, Fremont, Calif.; Ronald Colman, Maryport, England; Liam R. Heading, Livingston, Scotland; Eric Simpson, Edinburgh, United Kingdom

[73] Assignee: ATMI Ecosys Corporation, San Jose, Calif.

[21] Appl. No.: 708,256

[22] Filed: Sep. 6, 1996

Related U.S. Application Data

[63] Continuation-in-part of Ser. No. 622,861, Mar. 29, 1996.

[51] Int. Cl.$^6$ .................................................. C23C 16/00
[52] U.S. Cl. ............................... 118/715; 95/22; 96/243; 96/355
[58] Field of Search ............................ 118/715; 55/220, 55/257.1; 95/22; 96/243, 355

[56] References Cited

U.S. PATENT DOCUMENTS

| | | |
|---|---|---|
| 4,118,149 | 10/1978 | Hagberg . |
| 4,728,869 | 3/1988 | Johnson et al. . |
| 4,834,020 | 5/1989 | Bartholomew et al. . |
| 4,910,042 | 3/1990 | Hokynar . |
| 4,958,658 | 9/1990 | Zajac . |
| 4,993,358 | 2/1991 | Mahawili . |
| 5,011,520 | 4/1991 | Carr et al. . |
| 5,088,922 | 2/1992 | Kakizaki . |
| 5,113,789 | 5/1992 | Kamian . |
| 5,118,286 | 6/1992 | Sarin . |
| 5,136,975 | 8/1992 | Bartholomew et al. . |
| 5,199,853 | 4/1993 | Padden . |
| 5,211,729 | 5/1993 | Sherman . |
| 5,240,380 | 8/1993 | Mabe . |
| 5,250,092 | 10/1993 | Nakano . |
| 5,271,427 | 12/1993 | Berchem . |
| 5,361,800 | 11/1994 | Ewing . |
| 5,450,873 | 9/1995 | Palmer . |
| 5,518,696 | 5/1996 | Jain . |
| 5,681,368 | 10/1997 | Rahimzadeh ................................ 95/19 |
| 5,707,451 | 1/1998 | Robles et al. ............................ 118/715 |

OTHER PUBLICATIONS

McCabe et al, Unit Operations of Chemical Engineering, pp. 225–229, 1967.

*Primary Examiner*—Bruce Breneman
*Assistant Examiner*—Jeffrie R Lund
*Attorney, Agent, or Firm*—Steven J. Hultquist; Oliver A.M. Zitzmann

[57] ABSTRACT

A flow stabilization system for damping pressure variations in a process discharging an effluent gas stream, in which the process is pressure-sensitive and downstream pressure variations can adversely affect the upstream process, said system comprising a motive fluid driver constructed and arranged to receive the effluent gas stream from the process, and means for sensing a flow characteristic of the effluent gas stream and responsively adjusting the flow of the effluent gas stream to damp pressure fluctuations in the process. The flow stabilization system may further comprise: (i) a variable frequency drive for motively operating the motive fluid driver at a correspondingly variable rotational speed; (ii) a pressure transducer monitor for monitoring the flow characteristic of the effluent gas stream and generating a pressure transduced signal; and (iii) a proportional integral derivative controller coupled in pressure transduced signal-receiving relationship with the pressure transducer monitor, and responsive to the pressure transduced signal to correspondingly adjust the variable frequency drive and responsively selectively drive the motive fluid driver to damp pressure fluctuations in the process. The system has applicability to stabilizing pressure-sensitive processes such as vapor phase coating and reaction processes in semiconductor manufacturing.

60 Claims, 2 Drawing Sheets

FLOW-STABILIZED WET SCRUBBER SYSTEM FOR TREATMENT OF PROCESS GASES FROM SEMICONDUCTOR MANUFACTURING OPERATIONS

CROSS-REFERENCE TO RELATED APPLICATION

This is a continuation-in-part of U.S. patent application Ser. No. 08/622,861 filed Mar. 29, 1996 in the names of Scott Lane, Dinesh Shah, and Ronald Colman for "Pressure-Stabilized Wet Scrubber System for Treatment of Process Gases From Semiconductor Manufacturing Operations."

BACKGROUND OF THE INVENTION

1. Field of the Invention

This invention relates to pressure-sensitive process systems in which downstream gas or vapor pressure fluctuations can adversely affect an upstream process, e.g., reaction or deposition systems involving discharged gas streams which are in fluid flow communication with upstream components or unit operations of the process system.

More particularly, the invention relates to apparatus and method for maintaining a desired flow rate in the upstream process by control of the gas stream discharged from the upstream process.

2. Description of the Related Art

Semiconductor manufacturing facilities utilize chemical vapor deposition, ion implantation, photolithography, and a wide variety of other unit operations in the fabrication of large-scale epitaxial semiconductor devices, using process gases such as dichlorosilane, trichlorosilane, phosphine, arsine, hydrogen, and nitrogen derivatives, etc. The gaseous effluent from processing units in such facilities comprise the unconsumed process gases, as well as by-products of such gases. The gaseous effluent additionally may contain significant quantities of particulates such as silica, which must be removed, in addition to various water soluble components such as hydrochloric acid and residuals of phosphine and arsine.

Water scrubbing is commonly used to remove such particulates and water-soluble gases from the process effluent stream. In such scrubbing, the effluent gas is intimately contacted with water, e.g., by passage of the gaseous effluent through a static water spray, to dissolve the soluble gas components and wet and thereby remove the silica particulates. The scrubbing liquid may then be filtered, to remove the scrubbed particulates from the scrubbing medium.

Examples of commercial water scrubbers usefully employed in the semiconductor manufacturing industries, include the hydrodynamic fume scrubber disclosed and claimed in U.S. Pat. No. 5,011,520 issued Apr. 30, 1991 to William J. Carr and Raymond S. Krummen, the disclosure of which hereby is incorporated herein by reference, and other water scrubbers commercially available under the trademark Vector from ATMI EcoSys Corporation, San Jose, Calif., e.g., the Vector® Wet Scrubber ES-100.

One problem that has plagued the implementation and use of such water scrubbers has been the fluctuations in gas effluent pressure attendant their use. The water scrubber unit typically is deployed immediately upstream of a bulk exhaust for the entire plant facility, and is used to treat the process facility effluent, which may vary considerably in concentration of water-scrubbable components and particulates, depending on the specific types of semiconductor devices or subassembly parts which are being manufactured, and the resulting "mix" of unit operations being carried out in the process facility.

Where such unit operations involve the formation of thin film coatings or layers of critical thickness, such as in low pressure chemical vapor deposition (CVD) steps, the coating or layer thickness depends directly on the pressure level in the CVD reactor, and fluctuations in the pressure may result in corresponding variation in thickness or other film properties of the deposited material on the wafer substrate. Accordingly, fluctuations in the downstream flows and pressure at the bulk exhaust may fluidically propagate upstream perturbations which deleteriously affect the upstream process. In the extreme, pressure variations in the upstream process may result in manufactured structures which are deficient or even wholly useless for their intended purpose.

The aforementioned pressure perturbations may be of varying amplitude and/or frequency. It is self-evident that the minimization of such pressure fluctuations, by controlling the volumetric flow rate of effluent gas, and the maintenance of desired uniform pressure levels in the upstream process, will contribute markedly to the maintenance of process stability and the ability to satisfactorily fabricate the desired semiconductor devices.

It therefore would be a substantial advance in the art, and accordingly is an object of the present invention, to provide an improved water scrubbing system for the scrubbing of effluent gas streams such as semiconductor manufacturing plant effluents, to abate solubilizable components and particulate species therein.

It is another object of the present invention to provide an effluent gas stream control system which may be usefully employed with a water scrubbing system of such type, and which is adapted to attenuate perturbations of pressure in the upstream process by controlling the flow rate of effluent gas from the upstream process equipment, e.g. a chemical vapor deposition reactor chamber.

Another problem in the use of vapor phase reaction and deposition processes is the tendency of various reactant to form particulate solids, such as the silica particulates mentioned above. These particulates can clog orifices and impede fluid flows. By way of example, an atmospheric pressure CVD process that deposits silica ($SiO_2$) from tetraethylorthosilicate (TEOS) source reagent is subject to the problem that the TEOS is very reactive with traces of water, resulting in particulate formation and clogging of the orifices from which the TEOS is delivered. Consequently, the CVD system must periodically be shut down for clean up and maintenance of the TEOS delivery means. These shutdowns are expensive in terms of down-time and inefficient use of expensive CVD systems. It would therefore be a significant improvement in such processes to provide a means and method of maintaining a uniform flow of the source reagent into the CVD reactor despite the partial occlusion of the orifices, so that the CVD process facility is maintained on-stream in active processing mode a longer time before cleaning and maintenance becomes necessary.

It would be correspondingly an advance in the art, and is another object of the invention, to provide such means and method.

Other objects and advantages of the invention will be more fully apparent from the ensuing disclosure and appended claims.

Relative to the present invention hereinafter more fully disclosed, relevant art in the general field of the present invention is discussed below. U.S. Pat. No. 5,361,800 issued Nov. 8, 1994 to James H. Ewing discloses a liquid delivery and vaporization system including a positive displacement pump assembly for delivering a continuous volume flow at a constant rate to a vaporizer assembly for flash vaporizing the liquid. This effort at solving the problems attendant the occurrence of pressure oscillations in a process system utilizes a mechanical actuated butterfly valve. This control system reads exhaust pressure from a CVD tool and reacts to the pressure sensing by incrementally opening or closing the valve. However, typical high pressure oscillations have frequencies in the range of from about 0.05 to 0.20 second. The valve control system described in the Ewing patent has difficulty responding to oscillations in this frequency range.

A mechanical progressive valve is commercially available from Progressive Technologies, Inc. which includes an exhaust controller, but such valve assembly is highly specific to the source of the effluent gas (i.e., "tool-specific" in relation to process tools used in semiconductor manufacturing facilities), and is relatively expensive. U.S. Pat. No. 5,118,286 issued Jun. 2, 1992 to Michael C. Sarin describes a method and apparatus for operating a semiconductor wafer processing furnace in which multiple wafers are positioned in a reactor tube, and reaction gas is passed through the tube between the wafers. An inlet of an exhaust gas tube is located downstream from the wafers in the reactor tube. Spent reaction gas flows through the exhaust gas tube and an exhaust valve connected to the exhaust gas tube, and into an exhaust gas scrubber system. The total gas pressure in the reaction tube near the inlet of the exhaust tube is measured relative to ambient atmospheric pressure by a differential manometer and the flow of spent gases in the exhaust tube is controlled by comparing the pressure-indicating signal to a preset signal indicative of a preselected desired constant pressure to produce an error signal. The exhaust valve is automatically controlled as to its open character by the magnitude of the error signal. The differential manometer and control circuitry described in this reference are disclosed to control the measured pressure in the reactor tube with an accuracy of approximately 0.01 torr above ambient atmospheric pressure.

Other art of interest includes: U.S. Pat. No. 5,211,729 issued May 18, 1993 to Robert C. Sherman (baffle/settling chamber for removal of solid particulates from exhaust of semiconductor deposition equipment while reducing pressure fluctuation in the exhaust); U.S. Pat. No. 4,834,020 issued May 30, 1989 to Lawrence D. Bartholomew, et al. (atmospheric pressure chemical vapor deposition system with metering device connected to exhaust allowing continuous removal of reactant products, with wire scraper orifice cleaning arrangement); U.S. Pat. No. 4,993,358 issued Feb. 19, 1991 to Imad Mahawili (CVD reactor with independently adjustable multiple gas inlet orifices and exhaust ports); U.S. Pat. No. 5,113,789 issued May 19, 1992 to George D. Kamian (self-cleaning flow control orifice mounted in exhaust line for CVD apparatus); U.S. Pat. No. 5,136,975 issued Aug. 11, 1992 to Lawrence D. Bartholomew, et al. (injector with plates including hole arrays, defining a cascaded hole matrix arrangement for provision of uniform flow); and U.S. Pat. No. 5,450,873 issued Sep. 19, 1995 to David W. Palmer, et al. (regulator including a path, through which fluid passes, and a movably mounted piston having a frontal face, which is exposed to fluid in the path at a constriction point, and a distal face, which is exposed to a reference pressure, with the piston is mounted so that the weight of the piston exerts a force on the piston in a direction that tends to widen the path at the constriction point, and with a force being exerted on the piston, preferably by a spring under compression, in a direction that tends to narrow the path at the constriction point).

SUMMARY OF THE INVENTION

The present invention relates generally to apparatus and method utilizable in process facilities in which downstream gas or vapor pressure fluctuations can adversely affect an upstream process, e.g., a reaction or deposition process involving a discharged gas stream which is in fluid flow communication with the upstream process.

The apparatus and method of the invention effectively minimize the pressure fluctuations and control the volumetric flow rate of effluent gas in such process facilities, by passage of an effluent gas stream from the upstream process to a ring compressor, or other motive fluid driver such as a fan or blower. The motive fluid driver may be selectively driven in response to the flow characteristics of the effluent gas stream, in such manner as to damp pressure fluctuations in the upstream process. Alternatively, the motive fluid driver may be disposed downstream of a variable flow control valve or other flow control means, which is adjusted in response to the sensed flow characteristic, e.g., volumetric flow rate (or pressure, where the pressure-flow rate relationship is sufficiently determinable).

The pressure of the effluent gas stream may be monitored in any suitable manner and using any appropriate means. A pressure transducer monitor may be employed to monitor the pressure characteristic of the effluent gas stream, e.g., pressure per se, or pressure differential along the effluent gas stream flow path, and generate a suitable control signal for selectively adjusting the motive fluid driver, e.g., ring compressor, to maintain a desired flow characteristic in the upstream process.

A broad apparatus aspect of the invention relates to a flow stabilization system for attenuating pressure oscillations in a process discharging an effluent gas stream, in which pressure variations can adversely affect the process.

Such flow stabilization system may comprise (I) a ring compressor or other motive fluid driver, constructed and arranged (a) in receiving relationship to the effluent gas stream discharged from the process, and (b) for discharging a compressed effluent gas stream therefrom, and (II) means for sensing a flow characteristic of the effluent gas stream and responsively controlling the flow of the effluent gas stream to maintain a selected flow in the process discharging the effluent gas stream.

The aforementioned means for sensing a flow characteristic of the effluent gas stream and responsively controlling the motive fluid driver or other flow control means to maintain a selected flow rate in the process discharging the effluent gas stream, may comprise a part or region of the effluent gas stream flow path, which may include flow restricting or passage means, as a locus for sensing of the pressure characteristic. Associated with such locus may be any of a wide variety of pressure sensing and controlling means, including pressure taps, flow diverters, flow resistance or impedance devices, pressure sensors, pressure transducers, signal generating and transmitting means, actuators, power supplies, connectors, mechanical transmissions, coupling structures, and any other devices, structures, assemblies and subsystems, by which a flow characteristic can be sensed and employed to responsively control the motive fluid driver.

For example, such means may comprise (i) a variable frequency drive for motively operating the ring compressor at a correspondingly variable rotational speed; (ii) a pressure transducer monitor for monitoring the flow of the effluent gas stream and generating a pressure transduced signal; and (iii) a proportional integral derivative controller coupled in pressure transduced signal-receiving relationship with the pressure transducer monitor, and responsive to the pressure transduced signal to correspondingly adjust the variable frequency drive, to thereby adjust the ring compressor rotational speed and responsively maintain the flow in the upstream process at the desired level. By such arrangement, the flow of the effluent gas stream is controlled to attenuate pressure variations in the effluent gas stream and maintain the desired or set point volumetric flow rate in the process from which the effluent gas stream is discharged.

As a further example, such means may comprise an orifice plate defining a restricted flow passage through which the effluent gas stream is flowed, and across which the pressure drop characteristic is monitored by suitable sensing means. The sensed pressure drop may be employed directly to control the motive fluid driver, so that the pressure drop is maintained at a selected level by responsively varying the flow of the effluent gas stream under the action of the controlled motive fluid driver, thereby maintaining the volumetric flow rate in the upstream process at a desired level.

The above-described flow stabilization system may be arranged to discharge the effluent gas stream to a bulk exhaust for the process facility. The process itself may be of any suitable type, e.g., comprising a chemical vapor deposition reactor, a coating apparatus, or other process unit or plant.

The flow stabilization system may further comprise means for reducing water content of the effluent gas stream upstream of the ring compressor, such as a mist eliminator. Alternatively, or additionally, the system may comprise means for admixing with the effluent gas stream discharged from the process, air of lower relative humidity than the effluent gas stream, in sufficient relative proportions to prevent condensation of water from the effluent gas stream upstream of the ring compressor.

In a method aspect, the invention relates to a method of maintaining a selected volumetric flow rate in a process discharging an effluent gas stream.

Such method may comprise flowing the effluent gas stream from the process to a ring compressor or other motive fluid driver along an effluent gas stream flow path to a discharge terminus of the flow path; sensing a flow characteristic of the effluent gas stream from the process; and adjusting the motive fluid driver in response to the sensed flow characteristic so as to vary the flow of the effluent gas stream along the flow path to maintain a selected flow rate in the process.

In this method, the effluent gas stream may be passed from the ring compressor to a bulk exhaust for the process.

The process may for example comprise chemical vapor deposition, a coating operation, a reaction, or other suitable process step or technology.

In such method, water may be removed from the effluent gas stream upstream of the ring compressor. Illustrative methods for such water removal include passing the effluent gas stream through a mist eliminator, and/or admixing with the effluent gas stream discharged from the process, air of lower relative humidity than the effluent gas stream, in sufficient relative proportions to prevent condensation of water from the effluent gas stream upstream of the ring compressor.

The invention relates in another aspect to a system for treatment of an effluent gas stream containing aqueously scrubbable components for ultimate discharge to a bulk exhaust, wherein the effluent stream originates from an upstream process which is adversely affected by pressure fluctuations.

Such effluent gas stream treatment system may comprise:
a wet scrubber for contacting the effluent stream with an aqueous scrubbing stream for removal of at least a portion of the aqueously scrubbable components from the effluent gas stream, to yield a scrubbed effluent gas stream, and scrubbable components-enriched aqueous stream;
means for flowing the effluent gas stream to the wet scrubber, and for discharging the scrubbed effluent gas stream, and scrubbable components-enriched aqueous stream, from the wet scrubber;
a ring compressor or other motive fluid driver, constructed and arranged (a) in receiving relationship to the scrubbed effluent gas stream, and (b) for discharging a compressed effluent gas stream therefrom, and
means for sensing a flow characteristic of the effluent gas stream and responsively controlling the motive fluid driver to maintain a selected flow rate in the upstream process discharging the effluent gas stream.

The system described above, may further comprising air ballast source means for admixing with the effluent gas stream, ballast air in sufficient quantity and at sufficient rate to form an admixed effluent gas stream. Such ballast air addition may be employed to augment the flow of the effluent gas stream as necessary in order to achieve the desired flow control for maintaining the desired flow rate in the upstream process. Such ballast air addition is unnecessary where there is independent flow control in the effluent gas stream flow path. If, however, the motive fluid driver is operated at constant full speed with no variable flow control means in the effluent gas stream flow path, such ballast air (or other gas) addition may be employed with appropriate pressure control and valving to achieve the desired flow control for maintaining appropriate pressure in the upstream process.

Ballast air (or other gas) addition may also be employed when the effluent gas stream from the water scrubber unit is saturated with water, to yield an admixed stream of sub-saturated water concentration, for passage to the ring compressor or other motive fluid driver.

In systems of the invention including a water scrubber for treatment of the effluent gas stream discharged by the upstream process, a mist eliminator may be coupled to the wet scrubber for removing water from the scrubbed effluent gas stream, to prevent entrained water in the scrubbed effluent gas stream from entering the ring compressor or other motive fluid driver.

The effluent gas stream treatment system may be constructed and arranged as variously described above, and may be constructed and arranged to maintain a very low pressure variation in the upstream process.

In another aspect, the invention relates to a method of treatment of an effluent gas stream containing aqueously scrubbable components and ultimate discharge to a bulk exhaust, wherein the effluent gas stream originates from an upstream process which is adversely affected by pressure fluctuations. Such effluent gas stream is contacted with an aqueous scrubbing stream for removal of the aqueously scrubbable components from the effluent gas stream, to yield a scrubbed effluent gas stream, and scrubbable components-enriched aqueous stream. The resulting scrubbed effluent gas stream is then subjected to the method steps broadly described above, to maintain a desired pressure level in the upstream process.

Other aspects, features and embodiments will be more fully apparent from the ensuing disclosure and appended claims.

DETAILED DESCRIPTION OF THE INVENTION, AND PREFERRED EMBODIMENTS THEREOF

The disclosure of U.S. patent application Ser. No. 08/622,861, filed Mar. 29, 1996, is hereby incorporated herein by reference in its entirety.

The present invention is based on the discovery that a simple ring compressor or other motive fluid driver may be employed in an effluent gas stream and controllably operated in response to a sensed flow characteristic of the effluent gas stream to maintain a desired, e.g., substantially uniform, flow in an upstream process which is highly sensitive to, and deleteriously affected by, pressure variation.

Such pressure-sensitivity is characteristic of processes for the vapor phase deposition of films and coatings of exceedingly low thicknesses, such as in semiconductor manufacturing processes, where a downstream pressure surge or oscillation can cause back-pressure propagation of the pressure variation. In such processes, this back-propagation of varying pressure causes the vapor pressure of the deposition medium to increase or decrease outside of desired limits, and may causing significant corresponding non-uniformity of the applied deposition coating. Positive pressure increases thus may cause overdeposition of material, and negative pressure variation may cause underdeposition of material, which may damage or wholly ruin the intended product.

Such pressure variation effects are substantially reduced by the apparatus and method of the invention.

Figure 1:
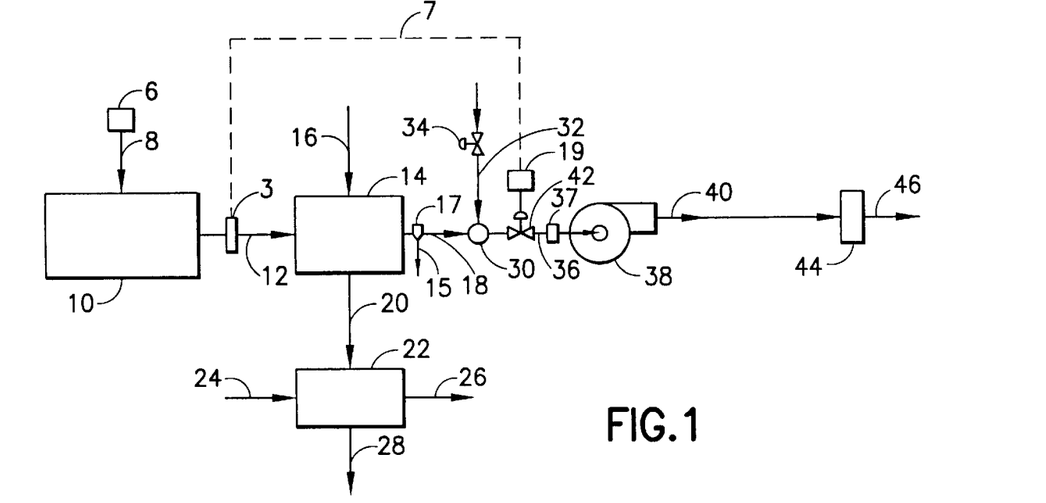
FIG. 1 is a schematic representation of a wet scrubbing system for the treatment of effluent gas containing scrubbable components, according to one embodiment of the present invention.

Referring now to the drawings, FIG. 1 shows a schematic representation of a wet scrubbing system for the treatment of effluent gas containing scrubbable components, according to one embodiment of the present invention.

As shown in the FIG. 1 flowsheet, the process unit 10 produces a gaseous effluent stream which is discharged from the process unit in line 12 and flowed therein to scrubbing complex 14.

The process unit 10 may for example comprise a CVD reactor to which a source reagent may be introduced from a source reagent supply vessel 6 through line 8 to the CVD reactor in the process unit.

An aqueous scrubbing medium is introduced to the scrubbing complex in line 16 for contacting with the gaseous effluent for removal of soluble components into the aqueous scrubbing medium, to yield a scrubbed effluent gas stream of reduced soluble components content. The aqueous scrubbing medium containing the solubilized gases, and optionally particulates scrubbed from the gaseous effluent stream, is discharged from the scrubbing complex 14 in line 20, and introduced to neutralization complex 22.

In the neutralization complex 22, a neutralization medium, such as a polyamine or sodium hydroxide, may be added to the scrubbing liquid, to raise the pH of the medium to a neutral or near-neutral value, when the scrubbing liquid discharged from the scrubbing complex is acidic in character. The neutralization medium is introduced to neutralization complex 22 in line 24, and precipitated solids, e.g., chemical sludge solids, are discharged from the neutralization complex in line 28, and may be further processed for final disposition or end use thereof. The neutralized liquid is discharged from the neutralization complex in line 26 and may be recycled in the process system, or alternatively discharged to receiving waters or other end use or final disposition.

Alternatively, the scrubbing liquid discharged from the scrubbing complex 14 may be otherwise treated, in lieu of treatment in the neutralization complex 22, by any other suitable means and/or methods appropriate to the nature of the scrubbing medium and the gaseous components (and optionally particulate solids) therein.

The scrubbed effluent gas stream of reduced soluble components content is discharged as a watersaturated gas stream from the scrubbing complex 14 in line 18, and optionally is passed to the mist eliminator 17 for removal of water from the scrubbed effluent gas stream, discharged in line 15. Additionally, or alternatively, the scrubbed effluent gas stream is flowed to the mixer chamber 30, in which the scrubbed effluent gas stream is admixed with ambient air flowed at selected, e.g., constant, or variable, flow rate through line 32 containing flow control valve 34 therein, for selectively adjusting the flow rate of the ambient air "ballast" gas. The ambient air flowed to the mixer chamber is preferably of a suitably low humidity character, and for such purpose the air may be passed through a bed of desiccant or water scrubbing scavenger to reduce the water content thereof to a desired level. Such low humidity ballast air admixing serves to reduce the relative humidity of such stream to appropriate levels to avoid or minimize the occurrence of deleterious condensation of water in process conduits and flow passages downstream from the mixer chamber. Such ballast air admixing also may be employed to control the flow of the effluent gas stream in a manner ensuring the maintenance of the desired pressure in the process unit 10.

The admixed gas stream comprising the scrubbed effluent gas stream and any added ballast air then is flowed in line 36 containing flow control valve 42 to the ring compressor 38 which serves as a regenerative blower in the overall gas treatment system. Disposed in line 36 upstream of the inlet of the ring compressor 38 is a particle filter 37 for removal from the effluent gas stream in line 36 of submicron size particles. The wet scrubber 14 is useful as a particle-capturing device for larger particulates but is not terribly efficient for particles in the submicron range. A consumable particle filter on the inlet of the compressor advantageously extends the life of the ring compressor in applications where the effluent gas stream contains significant submicron size particles. The particle filter could alternatively be positioned in line 36 upstream of the flow control valve 42, or upstream of the mixer chamber 30, as desired.

In the FIG. 1 system, the flow control valve 42 is selectively adjustable, e.g., manually or automatically, to provide a selected pressure drop from the wet scrubbing complex 14 to the bulk exhaust 44, and control the flow rate of the compressed effluent gas stream discharged from the ring compressor to the bulk exhaust. By this arrangement, the high frequency oscillations in the pressure of the gas discharged from the wet scrubber are damped by the ring compressor 38 and the flow control valve 42. The settings of the flow control valve 42 may be readily determined within the skill of the art, to provide the aforementioned pressure-stabilized operation of the overall process system, so that the pressure draw at the bulk exhaust of the overall system is maintained substantially uniform in the operation of the process facility.

The flow control valve 42 may be of any suitable type, e.g., a manually operated in-line valve. Alternatively, the valve may be coupled in controlled relationship with automatic valve controller means, such as a valve actuator unit 19, which adjusts the valve setting according to a predetermined cycle time program, or according to sensed process conditions, in response to signal generating sensor means 3 (e.g., pressure, temperature, composition, or flow rate sensors) interconnected with the valve 42 or valve actuator 19 in controlling relationship thereto, by means of signal transmission line 7.

Thus, the FIG. 1 process system is advantageously stabilized by the pressure-fluctuation-modulating apparatus and method of the invention. Such apparatus and method may also be employed, to overcome the deficiencies attendant the occurrence of particulate formation in the process unit. As mentioned hereinabove, the formation of $SiO_2$ particulates deriving from trace water reaction with TEOS in a CVD system may lead to orifice clogging and severe diminishment of the on-stream time that the CVD system can operate until shut-down, and maintenance cleaning is necessary.

With the pressure-fluctuation-modulating apparatus and method of the invention, the desired pressure drop from the upstream process (e.g., in FIG. 1, with the source reagent supply 6 delivering TEOS to the feed line 8 for flow to the CVD reactor in process unit 10) to the downstream variable flow rate valve (valve 42 in the FIG. 1 system) can be maintained, because the ring compressor will increase its suctional "pull" on the system. Therefore, TEOS source reagent in such system will continue to flow into the CVD reactor at the rate that is required for the $SiO_2$ deposition process.

The CVD reactor equipped with the pressure-fluctuation-modulating apparatus of the invention will therefore experience a significantly increased time between required maintenance shut-downs to remove particulate $SiO_2$ deposits from the orifices in the CVD system which is employed for the deposition of $SiO_2$ from TEOS. Such enhanced on-stream operating ability between maintenance shut-downs will also be characteristic of other applications of the invention in which particulate formation and orifice occlusion is an operating problem.

The ring compressor 38 may be of any suitable type now or hereafter known in the art, and appropriate for flowing the effluent gas stream from the locus of the process unit 10 and water scrubber complex 14.

By way of specific example of an illustrative ring compressor and process system, a Fuji Ring Compressor Model Number: 209A-7W, commercially available from Fuji Electric Corporation of America, Saddlebrook, N.J. 07663, and powered by a 3-phase, ⅓ horsepower motor, may advantageously be employed in combination with a Vector® Wet Scrubber ES-100 for the wet scrubbing of effluent gas from a semiconductor manufacturing facility.

As used herein, the term "ring compressor" refers to a non-positive displacement, high volume, low pressure blower that can operate either as a compressor or a vacuum pump. Such apparatus is sometimes referred to by other names such as regenerative blower, vortex blower, and side channel blower. In typical conformation, the ring compressor comprises an impeller mounted directly on a motor shaft and rotated at high speed, e.g., 2000–4000 rpms. On the periphery of the impeller is a large number of radial blades. The impeller is positioned between two end plates with the blades located with a channel on either side.

As the impeller rotates and the blades pass the inlet port, a low pressure region is formed which draws in the gases. The impeller blades impart motion to the gases by centrifugal force, throwing it outward and forward, where it follows the contour of the side channel and is returned to the base or roof of the impeller. This action is repeated many times, and a vortex is thereby formed, with the ultimately pressurized gas being stripped from the impeller and discharged from the housing of the ring compressor. The ring compressor is in essence a multistage compressor. Inlet vacuum pressures of up to 8 inches Hg are typically achievable, with discharge pressures of up to 5 psig, depending on the size of the ring compressor. Flow rates of up to 600 SCFM or higher are achievable, and the discharge gas stream from the ring compressor is free of pulsations. The only moving part of the ring compressor is the impeller. No lubrication is required, so that the discharged gas from the ring compressor is oil- and lubricant-free.

The pressurized gas effluent from the ring compressor 38 is discharged in line 40 and flowed to the bulk exhaust 44 of the process plant. The bulk exhaust may contain an exhaust fan, ventilator, or other egress means, from which the final effluent passes in line 46 (which may comprise a stack, pipe, channel, conduit, or other flow means) to the ambient air.

Figure 2:
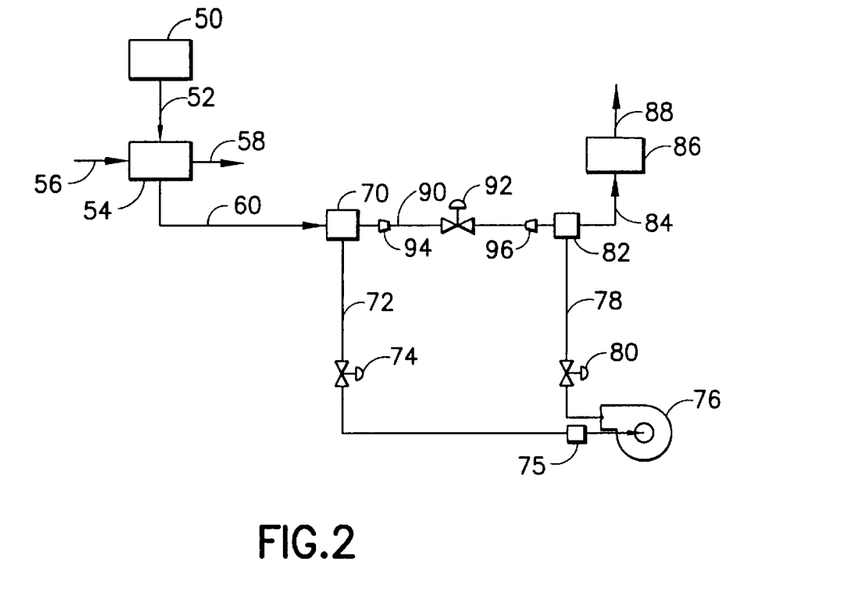
FIG. 2 is a schematic representation of a wet scrubbing system for the treatment of effluent gas containing scrubbable components, according to another embodiment of the present invention.

FIG. 2 is a schematic representation of a wet scrubbing system for the treatment of effluent gas containing scrubbable components, according to another embodiment of the present invention, which is constructed and arranged to maintain a selected pressure in the process unit.

In the FIG. 2 embodiment, the process unit 50 produces a gaseous effluent stream which is discharged from the process unit in line 52 and flowed therein to scrubbing complex 54. An aqueous scrubbing medium is introduced to the scrubbing complex in line 56 for contacting with the gaseous effluent for removal of soluble components into the aqueous scrubbing medium, to yield a scrubbed effluent gas stream of reduced soluble components content. The scrubbed effluent gas stream is discharged from the scrubbing complex 54 in line 60.

The scrubbing liquid is introduced to the scrubbing complex 54 in line 56, for contacting with the gaseous effluent stream therein, and impurity-containing scrubbing liquid is discharged from the scrubbing complex in line 58, and passed to suitable reclamation, recycling, treatment, or disposal facilities (not shown in FIG. 2).

The scrubbed effluent gas stream, reduced in soluble components, flows from the scrubbing complex 54 in line 60, through fitting 70 and line 72 containing flow control valve 74, to the ring compressor 76. As in the FIG. 1 embodiment, the ring compressor of the FIG. 2 system has a particle filter 75 upstream of the compressor inlet in line 72, to remove particulates not captured by the scrubber, and which in the absence of collection would deleteriously affect the ring compressor and reduce its active service life before maintenance becomes necessary.

The ring compressor discharges the compressed effluent to line 78 containing the flow control valve 80 therein. From line 78, the compressed effluent gas stream flows through fitting 82 to line 84 to the bulk exhaust 86 of the overall process facility. The bulk exhaust finally directs the effluent stream from the process facility in line 88.

Intermediate the fittings 70 and 82 in the FIG. 2 system is provided a gas flow line 90 containing flow control valve 92 therein, intermediate the valve adapter couplings 94 and 96. By such arrangement, there is provided a bypass loop, so that a portion of the effluent stream in line 60 entering fitting 70 can be directed into line 90, thereby bypassing the ring compressor, so that the ring compressor is isolatable for maintenance when necessary.

A pressure drop sensor/transducer could alternatively be joined in pressure sensing relationship with the scrubbed effluent gas stream in lines 72 and 78, by means of a pressure sensing tap respectively located in lines 72 and 78. The pressure drop sensor/transducer would monitor the pressure drop of the scrubbed effluent gas stream across the ring compressor 76 and responsively generate a signal indicative of the pressure drop. This signal is transmitted via a signal transmission line to a pressure controller, which is a proportional integral derivative (PID) controller.

The pressure controller, in response to the signal indicative of the pressure level, would generate a correlative control signal which is transmitted from the pressure controller via a second signal transmission line to the variable frequency drive (VFD). The variable frequency drive is thereby actuated and transmits a drive signal via drive coupling to the ring compressor 76, so that the ring compressor is driven at a speed which modulates the flow of the effluent gas stream and thereby damps pressure variations in the system, based on the pressure characteristic sensed by the pressure drop sensor/transducer.

The system illustrated in FIG. 2 may therefore be arranged to provide a highly constant pressure draw on the upstream complex 50, which may for example comprise a CVD process, ion implantation process, or other process unit operation or combination of unit operations.

The effluent gas stream treatment system of the present invention decreases pressure variations which may severely affect film uniformity in atmospheric pressure chemical vapor deposition (APCVD) systems. Testing of the effluent gas stream treatment system of the present invention has demonstrated a change in the character of the films produced by such APCVD process units, when the effluent gas stream treatment system. of the present invention is employed. In instances where the margins of a wafer being coated with an epitaxial thin film material has been unsuitable, the utilization of the effluent gas stream treatment system of the present invention has pressure-stabilized the APCVD unit, so that the marginal areas of the deposited films have correspondingly exhibited uniformity of the applied film material.

Figure 3:
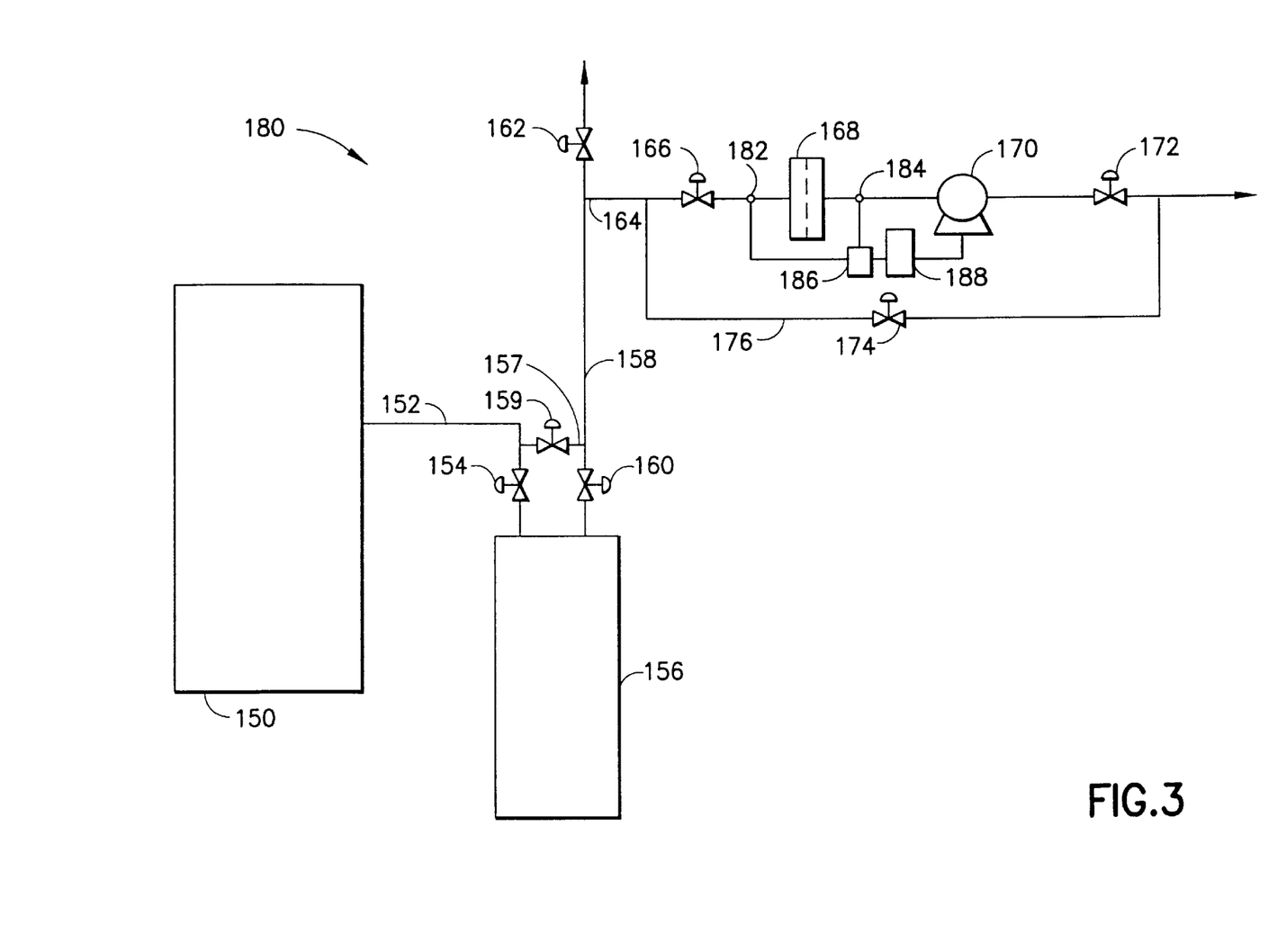
FIG. 3 is a schematic representation of a wet scrubbing system for the treatment of effluent gas containing scrubbable components, according to yet another embodiment of the invention.

FIG. 3 is a schematic representation of a wet scrubbing process system 180 for the treatment of effluent gas containing scrubbable components, according to yet another embodiment of the invention.

In the FIG. 3 embodiment, the semiconductor manufacturing process tool 150 generates an effluent gas stream which is discharged from the tool in line 152 containing valve 154 therein, to the scrubber complex 156. In the scrubber complex, the effluent gas stream is treated to remove scrubbable components therefrom. The resulting scrubbed effluent gas is discharged from the scrubber complex in line 158 containing valve 160 therein. The scrubbing complex may be bypassed by diverting the effluent gas stream from line 152 through line 157 containing valve 159 therein, to line 158.

From line 158, containing atmospheric bleed valve 162 at its upper end portion, the effluent gas stream passes to line 164 and flows through the valve 166, orifice plate 168, ring compressor 170 and valve 172, for discharge to the house exhaust of the semiconductor manufacturing facility. Line 164 is joined in latent flow communication with by-pass loop 176 containing valve 174 therein.

The flow characteristic of the effluent gas stream is sensed at pressure drop taps 182 and 184 by pressure sensor/transducer assembly 186 coupled to proportional integral derivative (PID) controller 188 for controllable adjustment of ring compressor 170 in response to the sensed pressure drop across the orifice plate 168.

Ring compressor 170 thereby is controlled to modulate the flow of the effluent gas stream so as to maintain a selected pressure drop across the orifice plate 168. In such manner, the pressure at the tool 150 is maintained at a selected flow consistent with the desired process conditions therefor.

Although the invention has been variously disclosed herein as illustratively comprising a wet scrubbing complex including a wet scrubber unit, it will be apparent that the utility of the invention is not thus limited. Contrariwise, the flow stabilization system of the present invention may be usefully employed to reduce pressure variations to a desired low level in other vapor-generating process systems. Examples of such gaseous effluent-generating complexes include CVD reactors, paint and coating spray booths, laminar air flow hoods where the air flow is critical in terms of oxygen and/or nitrogen concentration in the hood, nebulization apparatus for medicament delivery, etc.

As used herein, the term flow control means, flow passage means, lines, conduits, flow means, and the like, referring to the structural members conveying flows of gaseous or vapor streams, are intended to be broadly construed to encompass tubing, pipes, ducts, channels, passageways, as well as any other means, structures, and/or elements efficacious for carrying out fluid transfer or transport in the system of the present invention.

In like manner, the term lines, signal transfer means, and the like, when used in reference to the structures conveying signals in the flow stabilization system of the present invention, is intended to be broadly construed to encompass wires, cables, optical fibers and waveguides, wireless communications networks and interconnects, electromagnetically coupled signal transfer units, as well as any other means, structures, and/or elements efficacious for carrying out signal transfer or transport in the flow stabilization system of the pressure invention.

Finally, although the invention has been described herein with reference to various illustrative features, aspects, and embodiments, it will be appreciated that the invention is not thus limited, but that numerous variations, modifications and other embodiments are contemplated within the scope of the invention, and therefore all such variations, modifications and other embodiments are to be construed as being within the spirit and scope of the invention as hereafter claimed.

What is claimed is:

1. A flow stabilization system for damping pressure and flow rate increases and decreases in a process discharging an effluent gas stream, in which the process is pressure-sensitive and flow rate-sensitive, and downstream pressure and flow variations can adversely affect the upstream process, said system comprising a motive fluid driver constructed and arranged to receive the effluent gas stream from the process, and means for sensing a flow characteristic of the effluent gas stream and responsively adjusting the flow of the effluent gas stream to stabilize pressure and flow rate increases and decreases in the process.

2. A flow stabilization system according to claim 1, wherein the motive fluid driver comprises a ring compressor.

3. A flow stabilization system according to claim 2, further comprising means for reducing water content of the effluent gas stream upstream of the ring compressor.

4. A flow stabilization system according to claim 3, wherein the means for reducing water content of the effluent gas stream upstream of the ring compressor comprise a mist eliminator.

5. A flow stabilization system according to claim 3, wherein the means for reducing water content of the effluent gas stream upstream of the ring compressor comprise means for admixing with the effluent gas stream discharged from the process, air of lower relative humidity than the effluent gas stream, in sufficient relative proportions to prevent condensation of water from the effluent gas stream upstream of the ring compressor.

6. A flow stabilization system according to claim 2, wherein said means for sensing a flow characteristic of the effluent gas stream and responsively adjusting the flow of the effluent gas stream to stabilize pressure and flow rate increases and decreases in the process comprises a selectively adjustable variable flow control valve constructed and arranged for flowing the effluent gas stream therethrough to the ring compressor.

7. A flow stabilization system according to claim 6, further comprising a pressure sensor/transducer assembly coupled with said selectively adjustable variable flow control valve and operating to vary the flow of the effluent gas stream through said flow control valve, said pressure sensor/transducer also selectively driving the ring compressor at a selected fixed or variable speed to thereby dampen pressure variations which may, in the absence of such ring compressor and variable flow control valve, upset the upstream process by downstream pressure fluctuations.

8. A flow stabilization system according to claim 1, wherein the process comprises a process unit selected from the group consisting of chemical vapor deposition reactors and non-CVD coating apparatus.

9. A flow stabilization system according to claim 1, further comprising: (i) a variable frequency drive for motively operating the motive fluid driver at a correspondingly variable rotational speed; (ii) a pressure transducer monitor for monitoring the pressure characteristic of the effluent gas stream and generating a pressure transduced signal; and (iii) a proportional integral derivative controller coupled in pressure transduced signal-receiving relationship with the pressure transducer monitor, and responsive to the pressure transduced signal to correspondingly adjust the variable frequency drive and responsively selectively drive the motive fluid driver to stabilize the process.

10. A flow stabilization system according to claim 1, wherein the means for sensing a flow characteristic of the effluent gas stream comprise an orifice plate constructed and arranged for flow therethrough of the effluent gas stream, a pressure sensor/transducer assembly for sensing a pressure drop of the effluent gas stream across the orifice plate during flow of the effluent gas stream therethrough and responsively generating a control signal for responsively selectively driving the motive fluid driver to stabilize pressure and flow rate increases and decreases in the process.

11. A flow stabilization system for damping pressure and flow rate increases and decreases in a process discharging an effluent gas stream, in which the process is pressure-sensitive and flow rate-sensitive and downstream pressure and flow variations can adversely affect the upstream process, said system comprising a motive fluid driver constructed and arranged to receive the effluent gas stream from the process, an orifice plate upstream of said motive fluid driver between said motive fluid driver and the process, and means for sensing a pressure characteristic of the effluent gas stream across the orifice plate and responsively selectively adjusting the motive fluid driver to stabilize pressure and flow rate increases and decreases in the process.

12. A flow stabilization system for damping pressure and flow rate increases and decreases in a process discharging an effluent gas stream, in which the process is pressure-sensitive and flow rate-sensitive and downstream pressure and flow variations can adversely affect the upstream process, said system comprising a motive fluid driver constructed and arranged to receive the effluent gas stream from the process, and means for sensing a flow characteristic of the effluent gas stream and responsively selectively driving the motive fluid driver to stabilize pressure and flow rate increases and decreases in the process.

13. A method of stabilizing pressure and flow rate increases and decreases in a process discharging an effluent gas stream, in which pressure variations in the effluent gas stream can adversely affect the process, said method comprising:
flowing the effluent gas stream from the process to a ring compressor;
compressing the effluent gas stream in the ring compressor and discharging a compressed effluent gas stream therefrom; and
sensing a flow characteristic of the effluent gas stream and responsively selectively adjusting the flow of the effluent gas stream to stabilize pressure and flow rate increases and decreases in the effluent gas stream.

14. A method according to claim 13, wherein the process comprises chemical vapor deposition.

15. A method according to claim 13, wherein the process comprises a coating operation.

16. A method according to claim 13, wherein the process comprises a reactor.

17. A method according to claim 13, further comprising: (i) monitoring the flow characteristic of the effluent gas stream and generating a corresponding pressure characteristic signal, and motively operating the ring compressor, in response to the flow characteristic signal, at a selected rotational speed.

18. A method according to claim 13, further comprising removing water from the effluent gas stream upstream of the ring compressor.

19. A method according to claim 18, wherein the step of removing water from the effluent gas stream comprises passing the effluent gas stream through a mist eliminator.

20. A method according to claim 18, wherein the step of removing water from the effluent gas stream comprises admixing with the effluent gas stream discharged from the process, air of lower relative humidity than the effluent gas stream, in sufficient relative proportions to prevent condensation of water from the effluent gas stream upstream of the ring compressor.

21. A method according to claim 13, further comprising: (i) monitoring the flow characteristic of the effluent gas stream and generating a corresponding pressure characteristic signal; and (ii) motively operating the ring compressor, in response to the pressure characteristic signal, at a selected rotational speed to damp said pressure variation.

22. A system for treatment of an effluent gas stream containing aqueously scrubbable components, wherein the effluent gas stream originates from an upstream process which is adversely affected by pressure and flow fluctuations, said effluent gas stream treatment system comprising:

a wet scrubber for contacting the effluent stream with an aqueous scrubbing stream for removal of at least a portion of the aqueously scrubbable components from the effluent gas stream, to yield a scrubbed effluent gas stream, and scrubbable components-enriched aqueous stream;

means for flowing the effluent gas stream to the wet scrubber, and for discharging the scrubbed effluent gas stream, and scrubbable components-enriched aqueous stream, from the wet scrubber;

a ring compressor for compressing the scrubbed effluent gas stream to yield a compressed effluent gas stream;

means for flowing the scrubbed effluent gas stream to the ring compressor, and for discharging the compressed effluent gas stream;

means for sensing a flow characteristic of the effluent gas stream, and responsively adjusting the flow rate of the effluent gas stream, to stabilize said fluctuations.

23. A system according to claim 22, further comprising air ballast source means for admixing with the scrubbed effluent gas stream, upstream of the ring compressor, ballast air in sufficient quantity and at sufficient rate to form an admixed effluent gas stream of sub-saturated water concentration, for passage to the ring compressor.

24. A system according to claim 22, further comprising a mist eliminator coupled to said wet scrubber for removing water from the scrubbed effluent gas stream, to prevent entrained water in the scrubbed effluent gas stream from entering the ring compressor.

25. A system according to claim 22, wherein said means for sensing a flow characteristic of the effluent gas stream responsively selectively adjusts the motive fluid driver to stabilize said fluctuations.

26. A system according to claim 22, further comprising:
i. a variable frequency drive for motively operating the ring compressor at a selected rotational speed;
ii. a pressure transducer monitor for monitoring the pressure of the scrubbed effluent gas stream and generating a pressure transduced signal;
iii. a proportional integral derivative controller coupled in pressure transduced signal-receiving relationship with the pressure transducer monitor, and responsive to the pressure transduced signal to correspondingly adjust the variable frequency drive and responsively drive said ring compressor.

27. A system according to claim 22, further comprising:
(i) a variable frequency drive for motively operating the ring compressor at a selected rotational speed;
(ii) a pressure transducer monitor for monitoring the pressure of the scrubbed effluent gas stream and generating a pressure transduced signal;
(iii) a proportional integral derivative controller coupled in pressure transduced signal-receiving relationship with the pressure transducer monitor and responsive to the pressure transduced signal to correspondingly adjust the variable frequency drive and responsively drive said ring compressor at a speed to damp said pressure fluctuations.

28. A system according to claim 22, wherein said system is constructed and arranged to maintain pressure variation of the effluent gas stream below 0.05 inch water.

29. A method of treatment of effluent gas stream containing aqueously scrubbable components, wherein the effluent stream originates from an upstream process which is adversely affected by pressure and flow rate increases and decreases, said effluent gas stream treatment method comprising:

contacting the effluent stream with an aqueous scrubbing stream of a wet scrubber for removal of the aqueously scrubbable components from the effluent gas stream, to yield a scrubbed effluent gas stream, and scrubbable components-enriched aqueous stream;

flowing the effluent gas stream to the wet scrubber, and discharging the scrubbed effluent gas stream, and scrubbable components-enriched aqueous stream, from the wet scrubber;

compressing the effluent gas stream in a ring compressor to yield a compressed effluent gas stream, and discharging the compressed effluent gas stream; and sensing a flow characteristic of the effluent gas stream and responsively adjustably controlling flow of the effluent gas stream to stabilize pressure and flow rate increases and decreases in the effluent gas stream.

30. A method according to claim 29, further comprising:
i. motively operating the ring compressor at a selected rotational speed;
ii. monitoring the pressure of the scrubbed effluent gas stream and generating a corresponding pressure signal;
iii. adjusting the selected motive speed of the ring compressor in response to the corresponding pressure signal.

31. A method according to claim 29, further comprising:
(i) motively operating the ring compressor at a selected rotational speed;
(ii) monitoring the pressure of the scrubbed effluent gas stream and generating a corresponding pressure signal;
(iii) adjusting the selected motive speed of the ring compressor in response to the corresponding pressure signal to damp pressure fluctuations in the effluent gas stream.

32. A flow stabilization system for stabilizing pressure and flow rate increases and decreases in an upstream process discharging an effluent gas stream, in which the upstream process is sensitive to fluctuations in downstream flows and pressure producing perturbations that can adversely affect the upstream process, said system comprising a motive fluid driver constructed and arranged to flow the effluent gas stream from the upstream process through a downstream flow path, with said downstream flow path including a flow control valve and means for sensing a characteristic of the effluent gas stream selected from the group consisting of pressure, temperature, composition, and flow rate, and responsively adjusting the flow control valve to stabilize pressure and flow rate increases and decreases in the process.

33. A flow stabilization system according to claim 32, wherein the downstream flow path includes an orifice element through which the effluent gas stream is flowed.

34. A flow stabilization system according to claim 33, wherein the orifice element is interposed between control valves constructed and arranged for adjustment of the flow of the effluent gas stream to stabilize the process.

35. A flow stabilization system according to claim 32, constructed and arranged to maintain pressure variation of the effluent gas stream below 0.05 inch water.

36. A flow stabilization system for stabilizing pressure and flow rate increases and decreases in an upstream process discharging an effluent gas stream, in which the upstream process is pressure-sensitive and flow rate-sensitive and downstream pressure and flow variations can adversely affect the upstream process, said system comprising a motive fluid driver constructed and arranged to flow the effluent gas stream from the upstream process through a downstream flow path, and means for sensing a characteristic of the effluent gas stream and controlling the flow rate of the effluent gas stream to stabilize pressure and flow rate increases and decreases in the upstream process.

37. A flow stabilization system according to claim 36, wherein the means for sensing a characteristic of the effluent gas stream and controlling the flow rate of the effluent gas stream to stabilize the upstream process, comprise an orifice element, and means for determining the pressure drop across the orifice element and responsively adjusting the flow rate of the effluent gas stream to stabilize the upstream process.

38. A flow stabilization system according to claim 37, wherein the means for determining the pressure drop across the orifice element and responsively adjusting the flow rate of the effluent gas stream to stabilize the upstream process, comprise a pressure sensor/transducer assembly.

39. A flow stabilization system according to claim 37, wherein the means for determining the pressure drop across the orifice element and responsively adjusting the flow rate of the effluent gas stream to stabilize the upstream process, comprise means for adjusting the motive fluid driver.

40. A flow stabilization system according to claim 37, wherein the means for determining the pressure drop across the orifice element and responsively adjusting the flow rate of the effluent gas stream to stabilize the upstream process, comprise a flow control valve in the downstream flow path, and means for adjusting the flow control valve to stabilize the upstream process.

41. A flow stabilization system according to claim 37, wherein the orifice element is interposed between control valves constructed and arranged for adjustment of the flow of the effluent gas stream to stabilize the upstream process.

42. A flow stabilization system according to claim 37, comprising a flow control valve downstream from the orifice element, and wherein the flow of the effluent gas stream is adjusted in response to the pressure of the effluent gas stream to stabilize the upstream process.

43. A flow stabilization system for stabilizing pressure and flow rate increases and decreases in an upstream process discharging an effluent gas stream, in which the upstream process is pressure-sensitive and flow rate-sensitive and downstream pressure and flow variations can adversely affect the upstream process, said system comprising a motive fluid driver constructed and arranged to flow the effluent gas stream from the upstream process through a downstream flow path, and means for sensing a characteristic of the effluent gas stream and responsively adjusting the motive fluid driver to control the flow rate of the effluent gas stream and stabilize pressure and flow rate increases and decreases in the upstream process.

44. A flow stabilization system according to claim 43, wherein the motive fluid driver comprises a ring compressor.

45. A flow stabilization system for stabilizing pressure and flow rate increases and decreases in an upstream process discharging an effluent gas stream, in which the upstream process is pressure-sensitive and flow rate-sensitive and downstream pressure and flow variations can adversely affect the upstream process, said system comprising a motive fluid driver constructed and arranged to flow the effluent gas stream from the upstream process through a downstream flow path, a flow control valve in said downstream flow path, and means for sensing a characteristic of the effluent gas stream and responsively adjusting at least one of the motive fluid driver and the flow control valve to control the flow rate of the effluent gas stream and stabilize pressure and flow rate increases and decreases in the upstream process.

46. A flow stabilization system for stabilizing pressure and flow rate increases and decreases in an upstream process discharging an effluent gas stream, in which the upstream process is pressure-sensitive and flow rate-sensitive and downstream pressure and flow variations can adversely affect the upstream process, said system comprising a motive fluid driver constructed and arranged to flow the effluent gas stream from the upstream process through a downstream flow path, and means for sensing a pressure characteristic of the effluent gas stream and responsively adjusting the flow rate of the effluent gas stream to stabilize pressure and flow rate increases and decreases in the upstream process.

47. A flow stabilization system according to claim 46, wherein the pressure characteristic is a pressure drop in the downstream flow path.

48. A flow stabilization system according to claim 47, wherein the downstream flow path contains a flow restriction, and the pressure drop across the flow restriction is sensed as the pressure characteristic.

49. A flow stabilized semiconductor manufacturing process system, comprising:

a semiconductor manufacturing process unit discharging an effluent gas stream, wherein the semiconductor manufacturing process unit is pressure-sensitive and flow rate-sensitive and downstream pressure and flow variations can adversely affect the upstream semiconductor manufacturing process unit;

a flow stabilization system for stabilizing pressure and flow rate increases and decreases in the upstream semiconductor manufacturing process unit, said flow stabilization system comprising a downstream flow path through which the effluent gas stream is flowed, a motive fluid driver constructed and arranged to flow the effluent gas stream from the semiconductor manufacturing process unit through the downstream flow path, and means for sensing a characteristic of the effluent gas stream and controlling the flow rate of the effluent gas stream to stabilize pressure and flow rate increases and decreases in the upstream semiconductor manufacturing process unit.

50. A flow-stabilized semiconductor manufacturing process system according to claim 49, wherein the means for sensing a characteristic of the effluent gas stream and controlling the flow rate of the effluent gas stream to stabilize the upstream semiconductor manufacturing process unit comprise a flow control valve in the downstream flow path, means for sensing a characteristic of the effluent gas stream selected from the group consisting of pressure, temperature, composition and flow rate and responsively adjusting at least one of the motive fluid driver and flow control valve to stabilize the upstream semiconductor manufacturing process unit.

51. A method for stabilizing pressure and flow rate increases and decreases in an upstream process discharging an effluent gas stream, in which the upstream process is pressure-sensitive and flow rate-sensitive and downstream pressure and flow variations can adversely affect the upstream process, said method comprising sensing a characteristic of the effluent gas stream selected from the group consisting of pressure, temperature, composition, and flow rate, and responsively adjusting the flow rate of the effluent gas stream to stabilize pressure and flow rate increases and decreases in the upstream process.

52. A method according to claim 51, wherein the flow rate of the effluent gas stream is controlled by selectively modulating a flow control valve through which the effluent gas stream is flowed, in response to the sensed characteristic of the effluent gas stream.

53. A method according to claim 51, wherein the flow rate of the effluent gas stream is controlled by passing the effluent gas stream through an orifice, sensing the pressure drop in the effluent gas stream across the orifice, and responsively adjusting the flow rate of the effluent gas stream.

54. A method according to claim 51, wherein the flow rate of the effluent gas stream is controlled by flowing the effluent gas stream to a motive fluid driver and responsively adjusting the motive fluid driver.

55. A method according to claim 51, wherein pressure variation of the effluent gas stream is maintained below 0.05 inch water.

56. A method of stabilizing flow to damp pressure and flow rate increases and decreases in a semiconductor manufacturing process discharging an effluent gas stream, wherein the semiconductor manufacturing process is pressure-sensitive and flow rate-sensitive, and downstream pressure and flow variation can adversely affect the semiconductor manufacturing process, said method comprising flowing an effluent gas stream from the semiconductor manufacturing process through a downstream flow path, including a motive fluid driver constructed and arranged to flow the effluent gas stream through the downstream flow path, wherein a characteristic of the effluent gas stream is sensed and in response to such sensing the flow rate of the effluent gas stream is adjusted to stabilize pressure and flow rate increases and decreases in the semiconductor manufacturing process.

57. A flow stabilization system for damping pressure and flow rate increases and decreases in a process discharging an effluent gas stream, in which the process is pressure-sensitive and flow rate-sensitive, and downstream pressure and flow variations can adversely affect the upstream process, said system comprising means for sensing a characteristic of the effluent gas stream and responsively adjusting flow of the effluent gas stream to maintain a uniform effluent gas stream flow rate and stabilize the process.

58. A flow stabilization system according to claim 57, wherein the characteristic of the effluent gas stream is selected from the group consisting of pressure, temperature, composition, and flow rate.

59. A flow stabilization system according to claim 57, wherein said means for sensing a characteristic of the effluent gas stream comprises an orifice constructed and arranged for measuring a pressure drop of the effluent gas stream flowing therethrough.

60. A flow stabilization system for damping pressure and flow rate increases and decreases in a process discharging an effluent gas stream, in which the process is pressure-sensitive and flow rate-sensitive, and downstream pressure and flow variations can adversely affect the upstream process, said system comprising means for sensing a characteristic of the effluent gas stream and responsively adjusting a variable flow control valve to maintain a uniform effluent gas stream flow rate and stabilize the process.

* * * * *